United States Patent
Wang et al.

(10) Patent No.: US 9,627,546 B2
(45) Date of Patent: Apr. 18, 2017

(54) OXIDE THIN FILM TRANSISTOR, ARRAY SUBSTRATE, METHODS OF MANUFACTURING THE SAME AND DISPLAY DEVICE

(71) Applicant: BOE TECHNOLOGY GROUP CO., LTD., Beijing (CN)

(72) Inventors: Can Wang, Beijing (CN); Fang Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/535,772

(22) Filed: Nov. 7, 2014

(65) Prior Publication Data
US 2016/0035894 A1  Feb. 4, 2016

(30) Foreign Application Priority Data
Jul. 29, 2014 (CN) .......................... 2014 1 0367658

(51) Int. Cl.
*H01L 29/786* (2006.01)
*H01L 29/66* (2006.01)
(Continued)

(52) U.S. Cl.
CPC .... *H01L 29/7869* (2013.01); *H01L 21/02118* (2013.01); *H01L 27/1225* (2013.01); *H01L 27/1248* (2013.01); *H01L 29/24* (2013.01); *H01L 29/66969* (2013.01); *H01L 29/78633* (2013.01)

(58) Field of Classification Search
CPC ........... H01L 29/7869; H01L 29/78633; H01L 27/3272
See application file for complete search history.

(56) References Cited

U.S. PATENT DOCUMENTS 5,629,141 A * 5/1997 Kawamoto .......... G03C 1/7954
264/234
6,863,397 B2  3/2005 Nakano
(Continued)

FOREIGN PATENT DOCUMENTS

CN   101907807 A   3/2013
CN   102998863 A   3/2013

OTHER PUBLICATIONS

First Chinese Office action dated Jun. 23, 2016; Appln. No. 201410367658.6.
(Continued)

*Primary Examiner* — Michael Carter
(74) *Attorney, Agent, or Firm* — Ladas & Parry LLP

(57) ABSTRACT

An oxide thin film transistor, an array substrate, methods of manufacturing the same and a display device are disclosed. The oxide thin film transistor includes: a base substrate; and a gate electrode, a gate insulating layer, an oxide active layer, drain/source electrodes sequentially disposed on the base substrate. The oxide TFT transistor further includes an ultraviolet barrier layer disposed on the oxide active layer, the ultraviolet barrier layer is made of a resin material contains an ultraviolet absorbent. The stability of the oxide TFT is enhanced by disposing the ultraviolet barrier layer over the oxide active layer of the oxide TFT, since the ultraviolet barrier layer blocks the impact of UV light on the oxide TFT.

18 Claims, 5 Drawing Sheets

(51) Int. Cl.
*H01L 29/24* (2006.01)
*H01L 21/02* (2006.01)
*H01L 27/12* (2006.01)

(56) References Cited

U.S. PATENT DOCUMENTS

| | | | | |
|---|---|---|---|---|
| 2002/0005923 | A1* | 1/2002 | Satou | G02F 1/133514 |
| | | | | 349/106 |
| 2002/0024705 | A1* | 2/2002 | Nakano | G02B 1/116 |
| | | | | 398/159 |
| 2004/0185588 | A1* | 9/2004 | Fukuyoshi | G02B 3/0012 |
| | | | | 438/22 |
| 2010/0213423 | A1* | 8/2010 | Shiau | C09K 19/56 |
| | | | | 252/589 |
| 2010/0301327 | A1 | 12/2010 | Kang et al. | |
| 2011/0104389 | A1* | 5/2011 | Bryan-Brown | B82Y 10/00 |
| | | | | 427/510 |
| 2011/0169005 | A1* | 7/2011 | Saito | G02F 1/136204 |
| | | | | 257/59 |
| 2013/0026472 | A1 | 1/2013 | Chou et al. | |
| 2013/0063673 | A1 | 3/2013 | Choi et al. | |
| 2013/0134514 | A1* | 5/2013 | Chang | H01L 27/12 |
| | | | | 257/347 |
| 2014/0361287 | A1* | 12/2014 | Shieh | H01L 29/78633 |
| | | | | 257/43 |

OTHER PUBLICATIONS

Second Chinese Office Action dated Jan. 11, 2017, Appln. No. 201410367658.6.

* cited by examiner

OXIDE THIN FILM TRANSISTOR, ARRAY SUBSTRATE, METHODS OF MANUFACTURING THE SAME AND DISPLAY DEVICE

TECHNICAL FIELD

The disclosure relates to the field of LCD display, especially relates to an oxide thin film transistor and a manufacturing method thereof, an array substrate and a manufacturing method thereof, and a display device comprising the oxide thin film transistor array substrate.

BACKGROUND

As display devices become more sophisticated, there are increasingly high demands for the oxide active layer. As a kind of active layer material, an oxide semiconductor has the advantages of high carrier mobility, low fabrication temperature, good uniformity in large area, high optical transmittance etc., in comparison with the traditional material of amorphous silicon (a-Si), and these advantages also makes the oxide thin film transistor (Oxide TFT) suitable for the preparations of high resolution TFT-LCD, AM-OLED, flexible display, transparent display and other new types of display devices.

However, the stability problem of the oxide TFT has always been the manufacturers' concern, especially the damage to the device when the oxide device is exposed to UV irradiation. From the perspective of material characteristics, the width of band gap of the oxide semiconductor generally ranges from 3.2 eV to 3.6 eV, which has good absorption on the short-wavelength UV rays. Therefore, under the light irradiation and the gate supplied with long-time negative bias voltage, the threshold of the oxide thin film transistor (e.g. IGZO TFT) will shift sharply in negative direction, which will cause device failure. Because the threshold will shift in different directions when the bias voltage, interface state or fabrication process is changed, it is difficult to maintain long-time stability of the thin film transistor under the light irradiation. At present, this phenomenon can only be quantitatively interpreted by a conventional principle of injecting or capturing photogenerated holes, the effect of which depends on different energy levels of the photogenerated carriers formed on the surface of the channel.

SUMMARY

According to the first aspect of the present invention, an oxide thin film transistor comprises: a base substrate; and a gate electrode, a gate insulating layer, an oxide active layer, drain/source electrodes sequentially disposed on the base substrate; the oxide thin film transistor further comprising: an ultraviolet barrier layer disposed on the oxide active layer, wherein the ultraviolet barrier layer is made of a resin material comprising an ultraviolet absorbent.

According to the second aspect of the present invention, a method of manufacturing an oxide thin film transistor comprises: forming a gate electrode, a gate insulating layer, an oxide active layer on a base substrate; and forming an ultraviolet barrier layer on the oxide active layer, wherein the ultraviolet barrier layer is made of a resin material comprising an ultraviolet absorbent.

According to the third aspect of the present invention, an oxide thin film transistor array substrate comprises the above-mentioned oxide thin film transistor.

According to the fourth aspect of the present invention, a method of manufacturing an oxide thin film transistor array substrate comprises the above-mentioned method of manufacturing an oxide thin film transistor.

According to the fifth aspect of the present invention, a display device comprises the above-mentioned oxide thin film transistor array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The phrases "connect", "connected", etc., are not intended to define a physical connection or mechanical connection, but may include an electrical connection, directly or indirectly. "On," "under," "right," "left" and the like are only used to indicate relative position relationships, and when the position of the object which is described is changed, the relative position relationship may be changed accordingly.

For improving the stability of the oxide TFT, many research institutions have put forward some improvements, such as using top gate structure, color filter on array substrate (COA) structure, or BOA structure, etc. However, these improvements can not give timely and effective protection to the oxide layer, and can not present the transparent characteristic of the oxide semiconductor, therefore limiting the application scope of the oxide semiconductor.

Embodiment 1

The embodiment of the invention provides an oxide thin film transistor (TFT), comprising:
a base substrate; and
a gate electrode, a gate insulating layer, an oxide active layer, drain and source electrodes sequentially disposed on the base substrate;
the oxide thin film transistor further comprising:
an ultraviolet barrier layer disposed on the oxide active layer, wherein the ultraviolet barrier layer is made of a resin material comprising an ultraviolet absorbent.

In the oxide thin film transistor provided by the present embodiment, the stability of the oxide TFT is enhanced by disposing the ultraviolet barrier layer on the oxide active layer of the oxide TFT, and blocking the impact of UV light on the oxide TFT.

Embodiment 2

Figure 1:
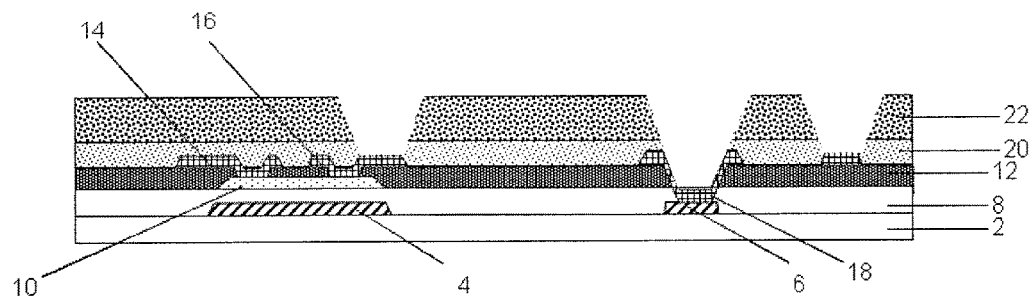
FIG. 1 schematically illustrates an oxide thin film transistor according to an embodiment of the present invention.

As illustrated in FIG. 1, the present embodiment provides an oxide TFT, comprising:
a base substrate 2; and
a gate electrode 4, a gate insulating layer 8, an oxide active layer 10, an etching stop layer 12, drain and source electrodes 14, 16, a first passivation layer 20 and a first protective layer 22 (also known as a resin layer) sequentially disposed on the base substrate 2;
wherein the etching stop layer 12 is the ultraviolet barrier layer. The ultraviolet barrier layer is made of a resin material comprising an ultraviolet absorbent to absorb UV light, e.g. the UV light with the wavelength in the range of 280 nm~380 nm.

The ultraviolet absorbent is such a light stabilizer that absorbs the UV part of both the sunlight and fluorescence. Different ultraviolet absorbents absorb UV light with different wavelength. The ultraviolet absorbent is selected according to the types of polymer in use.

For instance, the ultraviolet absorbent is selected from a group consisting of salicylates absorbent, benzophenone absorbent, benzotriazole absorbent, substituted acrylonitrile absorbent, triazine absorbent, hindered amine absorbent and combination thereof. Salicylate and its derivatives have the strong absorption to the ultraviolet light with the wavelength in the range of 280 nm~310 nm. Benzotriazole UV absorbent have the strong absorption to the ultraviolet light with the wavelength in the range of 280 nm~380 nm; Benzophenone UV absorbent have the strong absorption to the ultraviolet light with the wavelength in the range of 280 nm~320 nm. Triazine UV absorbent have the strong absorption to the ultraviolet light with the wavelength in the range of 280 nm~380 nm.

The resin material acts as a matrix material and is selected from, for instance, a group consisting of epoxy resin, acrylic resin, phenolic resin, polyamide resin and combination thereof. The ultraviolet absorbent is added into the resin material while forming the ultraviolet barrier layer. The resin material is monomers or polymers, both of which are irradiation-curable or thermal-curable, so the resin material can be cured by the method such as irradiation, heat, solvent evaporation etc.

The thickness of the ultraviolet barrier layer is typically in the range of 0.5 μm~1.5 μm. The ultraviolet absorbent in the resin material ranges from 0.1% to 10.0% by weight. If the additive amount is too little, it is difficult to block the UV impact on the active layer 10. If the additive amount is too much, the heat produced by the reaction will have additional impact on the device. As an example, the ultraviolet absorbent in the resin material ranges from 0.1% to 2.0% by weight.

In the oxide TFT provided by the present embodiment, the ultraviolet barrier layer replaces the etching stop layer 12 which is made of inorganic silica. The ultraviolet barrier layer not only blocks the etching process, but also absorbs the UV light, thereby avoiding the UV light entering into the oxide active layer 10, and enhancing the stability of the oxide TFT.

In other embodiments of the present invention, the ultraviolet barrier layer can also replace other insulating layers or resin layers in the oxide TFT. For instance, at least one of the first passivation layer 20 and the first protective layer 22 is an ultraviolet barrier layer. Alternatively, at least one of the etching stop layer 12, the first passivation layer 20 and the first protective layer 22 is an ultraviolet barrier layer. Therefore, when using only one ultraviolet barrier layer, the barrier layer can block the UV light entering into the oxide TFT, and enhance the stability of the oxide TFT. When using two or more ultraviolet barrier layers, the stability of the oxide TFT would be further improved due to the enhancement of the blocking effect.

Figure 2:
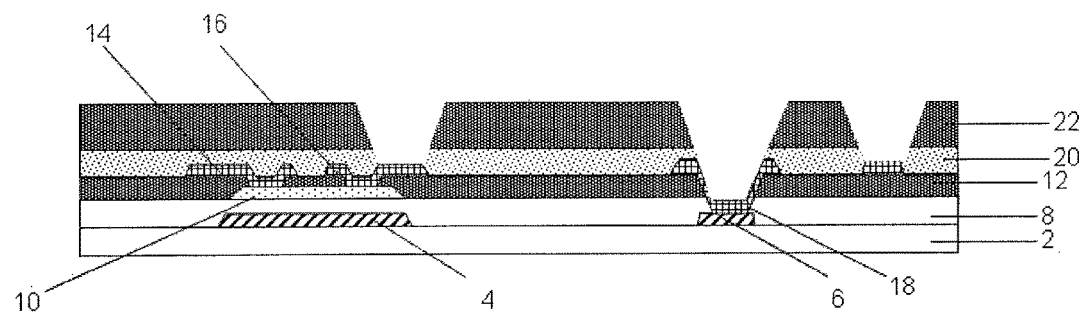
FIG. 2 schematically illustrates an oxide thin film transistor according to an embodiment of the present invention.

For instance, as illustrated in FIG. 2, the etching stop layer 12 and the first protective layer 22 are all made of the resin material comprising an ultraviolet absorbent, so as to double block the UV light entering into the oxide active layer 10.

In the oxide TFT of the present embodiment, when using back-channel etch (BCE) structure, the etching stop layer 12 can be omitted. In all embodiments of present invention, each of the base substrate 2, the gate electrode 4, the gate insulating layer 8, the oxide active layer 10, drain and source electrodes 14,16 may be made of known suitable materials. For instance, the base substrate 2 is made of glass or plastic; the gate electrode 4, drain and source electrodes 14,16 are made of metals or their alloys; the gate insulating layer 8 is made of silicon nitride ($SiN_x$) or silicon dioxide ($SiO_2$); the oxide active layer 10 is made of Indium Tin Zinc Oxide (ITZO), Hafnium Indium Zinc Oxide (HIZO), zinc oxide (ZnO), tin oxide (SnO), tin dioxide ($SnO_2$), cuprous oxide ($Cu_2O$) or zinc oxynitride (ZnNO). When the etching stop layer 12 does not act as the ultraviolet barrier layer, it may be made of silicon nitride ($SiN_x$), silica ($SiO_2$) or silicon oxynitride (SiON). When the first protective layer 22 does not act as the UV barrier layer, it may be made of the resin material.

Embodiment 3

The present embodiment provides a method of manufacturing an oxide TFT, comprising:
forming a gate electrode, a gate insulating layer, an oxide active layer on a base substrate; and
forming an ultraviolet barrier layer over the oxide active layer, wherein the ultraviolet barrier layer is made of the resin material comprising the ultraviolet absorbent.

In the method provided by the present embodiment, the stability of the oxide TFT is enhanced by forming an ultraviolet barrier layer over the oxide active layer 10 of the oxide TFT, and the ultraviolet barrier layer blocks the impact of UV light on the oxide TFT.

Embodiment 4

The present embodiment provides a method of manufacturing the oxide TFT of Embodiment 2, comprising:

Step 101: forming a gate electrode, a gate insulating layer, an oxide active layer on a base substrate;

Step 102: forming an etching stop layer on the oxide active layer, wherein the etching stop layer is the UV barrier layer made of the resin material comprising the UV absorbent; and Step 103: sequentially forming drain and source electrodes, a first passivation layer and a first protective layer on the etching stop layer.

Figure 6A:
FIG. 6a to 6i schematically illustrate each step of the method of manufacturing an oxide TFT array substrate according to an embodiment of the present invention.

In the above method, the step 101, for instance, comprises:

Step 101a: providing a base substrate 2, and rinsing the base substrate 2;

For instance, the base substrate 2 is rinsed by using methanol, acetone, ethanol, and then dried with nitrogen gas;

Step 101b: forming a gate metal layer on the rinsed base substrate 2 by a physical or chemical method (like sputtering, evaporation, spin-coating), and then patterning the gate metal layer to form the gate electrode 4 as illustrated in FIG. 6a (simultaneously forming the gate line 6).

Figure 6B:
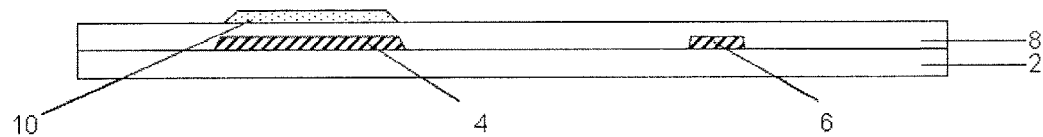

Step 101c: forming the gate insulting layer 8 on the base substrate 2 formed with the gate electrode 4, as illustrated in the FIG. 6b; the forming method is the same as the forementioned method of forming the gate metal layer.

Step 101d: forming an oxide layer on the gate insulting layer 8, and then patterning the oxide layer to form the oxide active layer 10 (FIG. 6b).

Figure 6C:
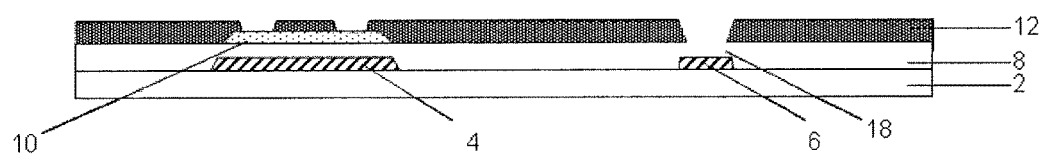

In the above method, the step 102, for instance, comprises:

Step 102a: adding a UV absorbent into the resin material to form a mixed liquid, wherein the UV absorbent in the resin material is 2% by weight;

Step 102b: coating the mixed liquid on the base substrate 2 formed with the oxide active layer 10, and curing by the method such as irradiation, heat, solvent evaporation etc;

Step 102c: patterning the cured UV layer to form the UV barrier layer, the UV barrier layer acts as the etching stop layer 12, as illustrated in FIG. 6c.

In the step 102a, the weight percentage of the UV absorbent in resin material is merely for exemplary purpose. In other embodiments, the percentage ranges from 0.1% to 10% by weight. If the additive amount is too little, it is difficult to block the UV impact on the active layer 10. If the additive amount is too much, the heat produced by the reaction will have additional impact on the device. As an example, the ultraviolet absorbent in the resin material ranges from 0.1% to 10% by weight.

Figure 6D:
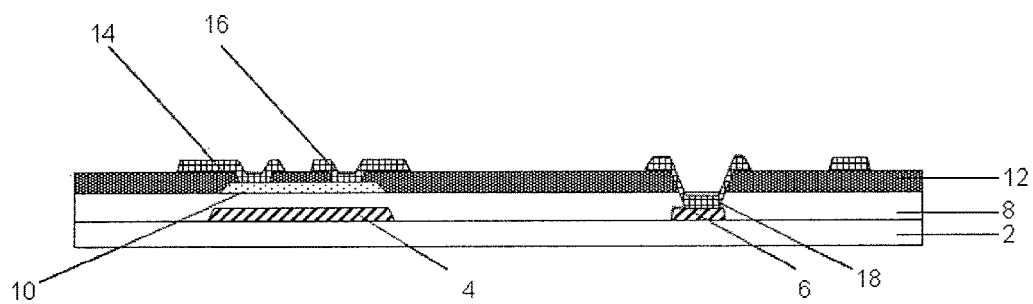

In the above method, the step 103, for instance, comprises:

Step 103a: forming a source and drain metal layer on the etching stop layer 12, and patterning the source and drain metal layer to form the source and drain electrodes 14,16 (simultaneously forming the data line 18), as illustrated in FIG. 6d.

Figure 6E:
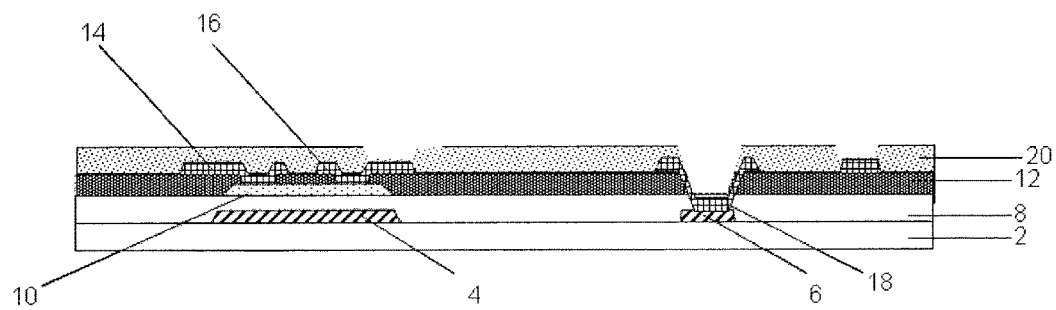
Figure 6F:
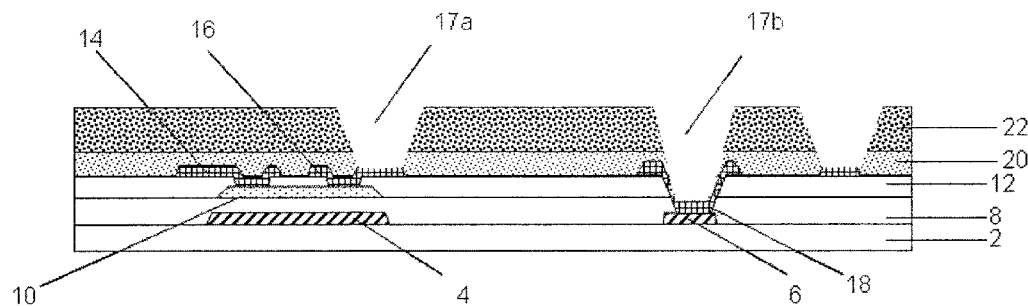

Step 103b: forming a first passivation film on the base substrate 2 formed with the source and drain electrodes 14,16, and then patterning the first passivation film to form the first passivation layer 20 as illustrated in FIG. 6e;

Step 103c: forming a first protective film on the base substrate 2 formed with the first passivation layer 20, and then patterning the first protective film to form the first protective layer 22 as illustrated in FIG. 6f.

The term "patterning" generally comprises processes of photoresist coating, exposing, developing, etching and photoresist peeling. The base substrate 2, the gate electrode 4, the gate insulating layer 8, the oxide active layer 10, the source and drain electrodes 14,16, the first passivation layer 20 and the first protective layer 22 in the present embodiment are made of the same materials as those described in Embodiment 2, which are not elaborated here. In the present embodiment, the gate line 6 is formed simultaneously with the formation of the gate electrode 4; the data line 18 is formed simultaneously with the formation of the source and drain electrodes 14, 16. As an example, in the process of patterning the first passivation film and the first protective film, it also needs to form a first hole 17a and a second hole 17b penetrating the two films. The first hole 17a is fabricated to connect the drain electrode 16 and a first electrode 24 (e.g. a pixel electrode) to be formed later, and the second hole 17b is fabricated to connect the data line 8 and a second electrode 28 (e.g. a common electrode). The process of fabricating the first hole 17a and the second hole 17b is not described in detail here.

In the above method, the ultraviolet barrier layer replaces the etching stop layer which is made of inorganic silica. The ultraviolet barrier layer not only block the etching process, but also absorbs the UV light, thereby avoiding the UV entering into the oxide active layer 10, and enhancing the stability of the oxide TFT.

In one example, at least one of the first passivation layer 20 and the first protective layer 22 is made of the resin material which comprises the UV absorbent. Alternatively, at least one of the etching stop layer 12, the first passivation layer 20 and the first protective layer 22 is made of the resin material which comprises the UV absorbent. For instance, as illustrated in FIG. 2, the UV barrier layer acts as the etching stop layer 12 and the first protective layer 22. In this case, the processes of fabricating the etching stop layer 12 and the first protective layer 22 are the same as those in the step 102, which is not described in detail here.

Embodiment 5

The present embodiment provides an oxide TFT array substrate, comprising the oxide TFT of the embodiment 1 or embodiment 2.

In the oxide TFT array substrate provided by the present embodiment, the stability of the oxide TFT is enhanced by forming an ultraviolet barrier layer over the oxide active layer of the oxide TFT, and the ultraviolet barrier layer blocks the impact of UV light on the oxide TFT.

In addition to dispose the ultraviolet barrier layer in the oxide TFT, the ultraviolet barrier layer can also be disposed in other layers of the oxide TFT array substrate.

Figure 3:
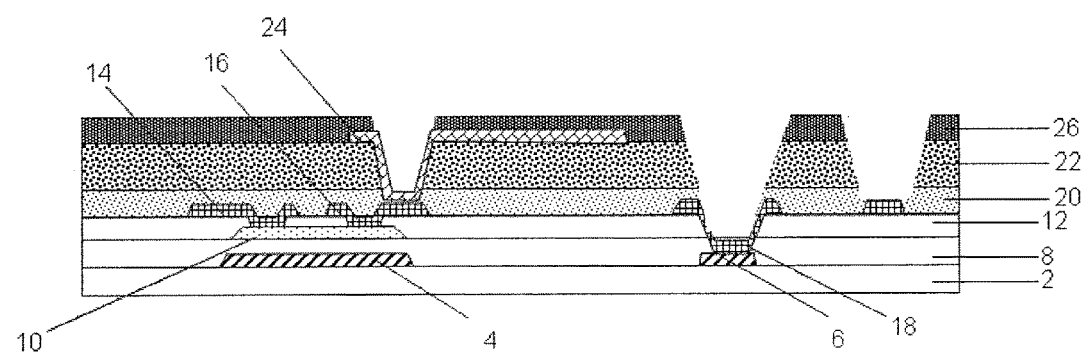
FIG. 3 schematically illustrates an oxide thin film transistor array substrate according to an embodiment of the present invention.

For instance, as illustrated in FIG. 3, the oxide TFT array substrate further comprises a first electrode 24 and a second passivation layer 26 sequentially disposed on the oxide TFT, wherein the second passivation layer 26 is made of the resin material comprising the ultraviolet absorbent.

Figure 4:
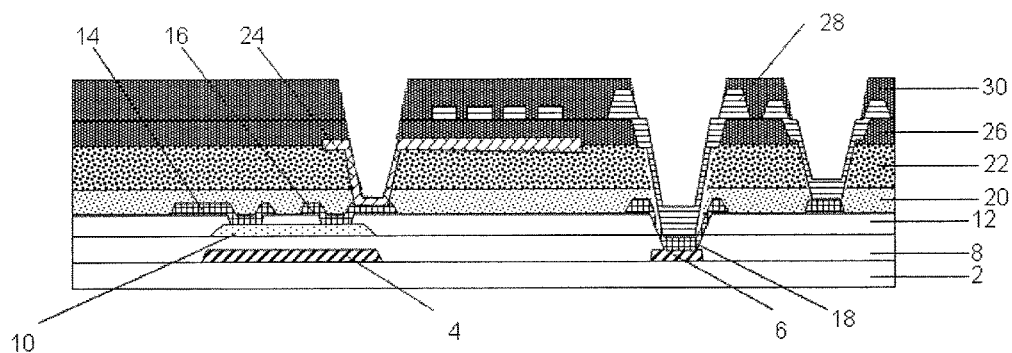
FIG. 4 schematically illustrates an oxide thin film transistor array substrate according to an embodiment of the present invention.

For instance, as illustrated in FIG. 4, the oxide TFT array substrate further comprises a first electrode 24, a second passivation layer 26, a second electrode 28 and a second protective layer 30 sequentially disposed on the oxide TFT, wherein the second passivation layer 26 and the second protective layer 30 are all made of the resin material comprising the ultraviolet absorbent. In other embodiments, at least one of the second passivation layer 26 and the second protective layer 30 is made of the resin material comprising the ultraviolet absorbent, and the objects of the present invention can also be achieved.

Figure 5:
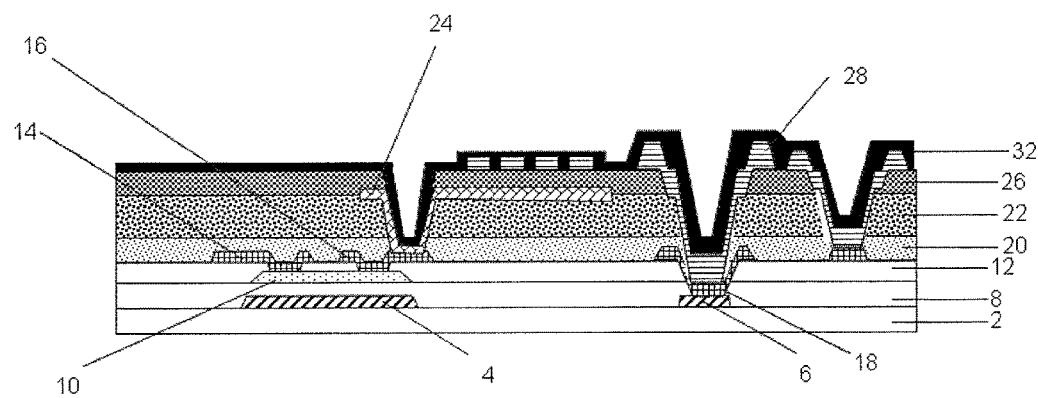
FIG. 5 schematically illustrates an oxide thin film transistor array substrate according to an embodiment of the present invention.

For instance, as illustrated in FIG. 5, the oxide TFT array substrate further comprises a first electrode 24, a second passivation layer 26 and an alignment layer 32 sequentially disposed on the oxide TFT, wherein the alignment layer 32 is made of the resin material comprising the ultraviolet absorbent. In other embodiments, at least one of the second passivation layer 26 and the alignment layer 32 is made of the resin material comprising the ultraviolet absorbent, and the objects of the present invention can also be achieved.

In the present embodiment, the first electrode 24 is a pixel electrode, for instance, and the second electrode is a common electrode, for instance. The pixel electrode and common electrode is interchangeable in their positions. It is can be contemplated that the UV barrier layer can be at least one of the etching stop layer 12, the first passivation layer 20, the first protective layer 22, the second passivation layer 26, the second protective layer 30 and the alignment layer 32 in the oxide TFT array substrate provided by the present embodiment, so that it can block the impact of UV light on the oxide device, and enhance the stability of the oxide device. Besides, when using back-channel etch (BCE) structure, the etching stop layer 12 can be omitted.

Embodiment 6

The present embodiment provides a method of manufacturing an oxide TFT array substrate, comprising the method of manufacturing the oxide TFT in embodiment 3 or embodiment 4.

In the method of manufacturing an oxide TFT array substrate provided by the present embodiment, the stability of the oxide TFT is enhanced by disposing an ultraviolet barrier layer over the oxide active layer of the oxide TFT, and blocking the impact of UV light on the oxide TFT.

In addition to form the ultraviolet barrier layer in the oxide TFT, the ultraviolet barrier layer can also be formed in other layers of the oxide TFT array substrate.

Figure 6G:
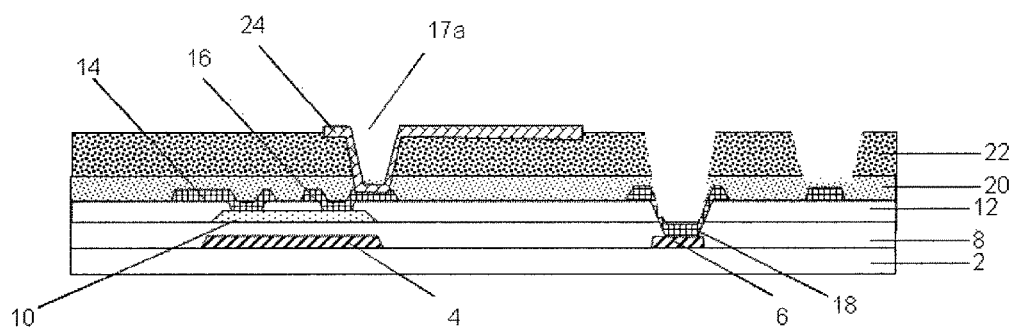
Figure 6H:
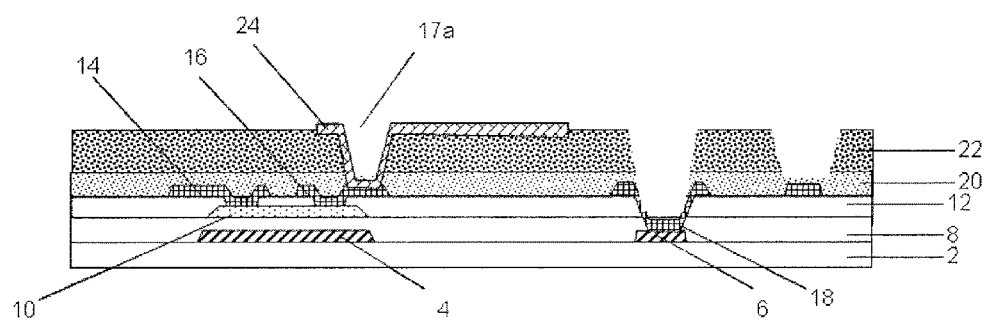

For instance, the method of manufacturing the oxide TFT array substrate as illustrated in FIG. 3 comprises:

Step 201: forming an oxide TFT on a base substrate 2, the oxide TFT sequentially comprising a gate electrode 4, a gate insulating layer 8, an oxide active layer 10, an etching stop layer 12, drain and source electrodes 14, 16, a first passivation layer 20 and a first protective layer 22;

Step 202: forming a first metal layer on the base substrate fabricated with the first protective layer 22, and then patterning the first metal layer to form the first electrode 24 as illustrated in FIG. 6g, wherein the first electrode 24 connects to the drain electrode 16 by a through hole 17a;

Step 203: forming a second passivation layer 26 on the base substrate fabricated with the first electrode 24, wherein the passivation layer 26 is made of the resin material comprising the ultraviolet absorbent, as illustrated in FIG. 6h; this step is the same as the step 102, and is not described in detail here.

Figure 6I:
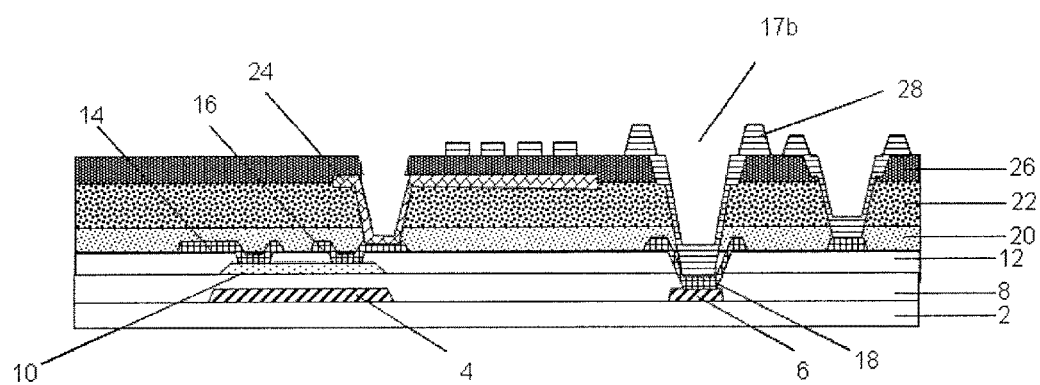

For instance, the method of manufacturing the oxide TFT array substrate as illustrated in FIG. 4 comprises:

Step 301: forming an oxide TFT on a base substrate 2, the oxide TFT sequentially comprising a gate electrode 4, a gate insulating layer 8, an oxide active layer 10, an etching stop layer 12, drain and source electrodes 14, 16, a first passivation layer 20 and a first protective layer 22;

Step 302: sequentially forming a first electrode 24, a second passivation layer 26, a second electrode 28 and a second protective layer 30 on the oxide TFT, wherein the second passivation layer 26 and the second protective layer 30 are all made of the resin material comprising the ultraviolet absorbent. In this step, the cross section view of the substrate after forming the second electrode 28 is illustrated in FIG. 6i, in which the second electrode 28 connects to the data line 18 by a second through-hole 17b.

For instance, the method of manufacturing the oxide TFT array substrate as illustrated in FIG. 5 comprises:

Step 401: forming an oxide TFT on a base substrate 2, the oxide TFT sequentially comprising a gate electrode 4, a gate insulating layer 8, an oxide active layer 10, an etching stop layer 12, drain and source electrodes 14, 16, a first passivation layer 20 and a first protective layer 22;

Step 402: sequentially forming a first electrode 24, a second passivation layer 26 and an alignment layer 32 on the oxide TFT, wherein the alignment layer 32 is made of the resin material comprising the ultraviolet absorbent.

For instance, the formation of the alignment layer 32 comprises: adding the UV absorbent into the liquid for fabricating the alignment layer 32 such as Polyimide (PI) or Polyvinyl alcohol (PVA) etc.; coating the mixed liquid on the second passivation layer 26; and curing.

In the present embodiment, no matter whether the UV barrier layer is formed in the oxide TFT or formed in other layers of the oxide TFT array substrate, it can also block the UV light impact on an oxide device, and enhance the stability of the oxide device.

Embodiment 7

The present embodiment provides a display device comprising an oxide TFT array substrate of the embodiment 5 or embodiment 6. The display device can be any product or component with the function of display such as a liquid crystal panel, an electronic paper, an OLED panel, a plasma panel, a LCD TV, a LCD display, a digital photo frame, a mobile phone, a tablet PC etc.

An example of the display device is a LCD device, in which the array substrate and the opposed substrate are disposed opposite to each other to form a liquid crystal cell, which is filled with a liquid crystal material. The opposed substrate, for instance, is a color filter substrate. The pixel electrode in each pixel unit of the array substrate is used to apply an electric field to control the rotation degree of the liquid crystal material so as to conduct a display operation. In some examples, the liquid crystal display device further comprises a backlight source used to provide backlight for the array substrate.

Another example of the display device is an organic electroluminescent display device (OLED), in which a lamination of an organic light-emitting material are formed on the array substrate, and the pixel electrode of each pixel unit functions as an anode or a cathode for driving the organic light emitting materials to conduct a display operation.

Another example of the display device is an electronic paper display device, in which an electronic ink layer is formed on the array substrate, and the pixel electrode of each pixel unit functions as applying a voltage to drive a charged particle in the electronic ink moving for a display operation In the display device provided by the present embodiment, the stability of the display device is enhanced by forming an ultraviolet barrier layer over the oxide active layer, the ultraviolet barrier layer blocks the impact of UV light on the display device.

What are described above is related to the illustrative embodiments of the disclosure only, and not limitative to the scope of the disclosure, the scopes of the disclosure are defined by the accompanying claims.

The invention claimed is:

1. An oxide thin film transistor, comprising:
   a base substrate; and a gate electrode, a gate insulating layer, an oxide active layer, drain/source electrodes sequentially disposed on the base substrate;

the oxide thin film transistor further comprising:

an ultraviolet barrier layer disposed on the oxide active layer, wherein the ultraviolet barrier layer is made of a resin material comprising an ultraviolet absorbent, the oxide thin film transistor further comprising an etching stop layer disposed between the oxide active layer and drain/source electrodes, wherein the ultraviolet barrier layer acts as the etching stop layer, and the etching stop layer and the ultraviolet barrier layer consist of the resin material comprising the ultraviolet absorbent and are the same layer.

2. The oxide thin film transistor according to claim 1, further comprising a first passivation layer and a first protective layer sequentially disposed on the drain/source electrodes, wherein at least one of the first passivation layer and the first protective layer is made of a resin material comprising an ultraviolet absorbent.

3. The oxide thin film transistor according to claim 2, wherein the first passivation layer and the first protective layer are made of the resin material comprising the ultraviolet absorbent.

4. The oxide thin film transistor according to claim 1, wherein the ultraviolet absorbent is selected from the group consisting of salicylates absorbent, benzophenone absorbent, benzotriazole absorbent, substituted acrylonitrile absorbent, triazine absorbent and hindered amine absorbent.

5. The oxide thin film transistor according to claim 1, wherein the resin material is selected from the group consisting of epoxy resin, acrylic resin, phenolic resin polyamide resin and combination thereof.

6. The oxide thin film transistor according to claim 1, wherein the ultraviolet absorbent in the resin material ranges from 0.1% to 10.0% by weight, and a thickness of the ultraviolet barrier layer ranges from 0.5 μm to 1.5 μm.

7. An oxide thin film transistor array substrate, comprising the oxide thin film transistor according to claim 1.

8. The oxide thin film transistor array substrate according to claim 7, further comprising a first electrode and a second passivation layer sequentially disposed on the oxide thin film transistor, wherein the second passivation layer is made of a resin material comprising an ultraviolet absorbent.

9. The oxide thin film transistor array substrate according to claim 7, further comprising a first electrode, a second passivation layer, a second electrode and a second protective layer sequentially disposed on the oxide thin film transistor, wherein at least one of the second passivation layer and the second protective layer is made of a resin material comprising an ultraviolet absorbent.

10. The oxide thin film transistor array substrate according to claim 7, further comprising a first electrode, a second passivation layer and an alignment layer sequentially disposed on the oxide thin film transistor, wherein at least one of the second passivation layer and the alignment layer is made of a resin material comprising an ultraviolet absorbent.

11. The oxide thin film transistor array substrate according to claim 10, wherein the second passivation layer and the alignment layer are made of the resin material comprising the ultraviolet absorbent.

12. A method of manufacturing an oxide thin film transistor, comprising:

forming a gate electrode, a gate insulating layer, an oxide active layer on a base substrate; and forming an ultraviolet barrier layer on the oxide active layer, wherein the ultraviolet barrier layer is made of a resin material comprising an ultraviolet absorbent, the method further comprising:

forming an etching stop layer on the oxide active layer, wherein the ultraviolet barrier layer is the etching stop layer, and the etching stop layer and the ultraviolet barrier layer consist of the resin material comprising the ultraviolet absorbent and are the same layer.

13. The method according to claim 12, further comprising:

sequentially forming drain/source electrodes, a first passivation layer and a first protective layer on the oxide active layer, wherein at least one of the first passivation layer and the first protective layer is made of a resin material comprising an ultraviolet absorbent.

14. The method according to claim 13, wherein the first passivation layer and the first protective layer are made of the resin material comprising the ultraviolet absorbent.

15. The method according to claim 12, wherein the ultraviolet absorbent is selected from the group consisting of salicylate absorbent, benzophenone absorbent, benzotriazole absorbent, substituted acrylonitrile absorbent, triazine absorbent or hindered amine absorbent.

16. The method according to claim 12, wherein the resin material is selected from a group consisting of epoxy resin, acrylic resin, phenolic resin, polyamide resin and combination thereof.

17. The method according to claim 12, wherein the ultraviolet absorbent in the resin material ranges from 0.1% to 10.0% by weight, and a thickness of the ultraviolet barrier layer ranges from 0.5 μm to 1.5 μm.

18. The method according to claim 12, wherein forming the ultraviolet barrier layer comprising:

adding the ultraviolet absorbent into a resin material to form a mixture; and coating and curing the mixture to form the ultraviolet barrier layer.

* * * * *